(12) United States Patent
Millar

(10) Patent No.: US 10,985,757 B2
(45) Date of Patent: *Apr. 20, 2021

(54) DYNAMIC IMPEDANCE CONTROL FOR INPUT/OUTPUT BUFFERS

(71) Applicant: Conversant Intellectual Property Management Inc., Ottawa (CA)

(72) Inventor: Bruce Millar, Stittsville (CA)

(73) Assignee: Conversant Intellectual Property Management Inc., Ottawa (CA)

( * ) Notice: Subject to any disclaimer, the term of this patent is extended or adjusted under 35 U.S.C. 154(b) by 0 days.

This patent is subject to a terminal disclaimer.

(21) Appl. No.: 16/795,786

(22) Filed: Feb. 20, 2020

(65) Prior Publication Data

US 2020/0266818 A1    Aug. 20, 2020

Related U.S. Application Data

(63) Continuation of application No. 15/457,680, filed on Mar. 13, 2017, now Pat. No. 10,608,634, which is a continuation of application No. 15/079,085, filed on Mar. 24, 2016, now abandoned, which is a continuation of application No. 14/499,275, filed on Sep. 29, 2014, now Pat. No. 9,300,291, which is a continuation of application No. 13/248,330, filed on Sep. 29, 2011, now Pat. No. 8,847,623, which is a continuation of application No. 12/915,796, filed on Oct. 29, 2010, now Pat. No. 8,035,413, which is a continuation of application No. 12/134,451, filed on Jun. 6, 2008, now Pat. No. 7,834,654.

(60) Provisional application No. 60/942,798, filed on Jun. 8, 2007.

(51) Int. Cl.
*H03K 19/00* (2006.01)

(52) U.S. Cl.
CPC .............................. *H03K 19/0005* (2013.01)

(58) Field of Classification Search
CPC ................................................. H03K 19/0005
USPC .......................................................... 326/30
See application file for complete search history.

(56) References Cited

U.S. PATENT DOCUMENTS

| 8,963,578 B2* | 2/2015 | Wu | H04L 25/0278 326/30 |
|---|---|---|---|
| 2002/0118037 A1* | 8/2002 | Kim | H04L 25/0298 326/30 |
| 2003/0197525 A1* | 10/2003 | Song | H04L 25/0278 326/30 |
| 2007/0139071 A1* | 6/2007 | Nguyen | H03K 19/0005 326/30 |

(Continued)

*Primary Examiner* — Don P Le
(74) *Attorney, Agent, or Firm* — Conversant IP Management

(57) ABSTRACT

A system and method of performing off chip drive (OCD) and on-die termination (ODT) are provided. A common pull-up network composed of transistors and a common pull-down network composed of transistors are employed to implement both of these functions. In drive mode, the pull-up network is configured to produce a calibrated drive impedance when an "on" output is to be generated, and the pull-up network is configured to produce a calibrated drive impedance when an "off" output is to be generated. In termination mode, the pull-up network and the pull-down network are configured to produce a calibrated pull-up resistance and pull-down resistance respectively such that together, they form a split termination.

7 Claims, 11 Drawing Sheets

(56) References Cited

U.S. PATENT DOCUMENTS

2008/0074140 A1* 3/2008 Park .............. H03K 19/018571
  326/30
2008/0112233 A1* 5/2008 Woo .................... G11C 7/1057
  365/189.05
2013/0162286 A1* 6/2013 Lee .................. H03K 19/00315
  326/30

* cited by examiner

Truth Table 214

| | Inputs | | | | | Ouputs | | | Effect at PAD | Mode |
|---|---|---|---|---|---|---|---|---|---|---|
| | SJ | DO | DJ | OE | OJ | TE | DPU | DPD | TON | | |
| 215→ | 0 | X | X | 0 | X | 0 | 0 | 0 | 0 | Floating | Normal High-Speed |
| 216→ | | 0 | X | 1 | X | 0 | 0 | 1 | 0 | Driver Low | |
| 218→ | | 1 | X | 1 | X | 0 | 1 | 0 | 0 | Driver High | |
| 220→ | | X | X | 0 | X | 1 | 0 | 0 | 1 | Termination 'ON' | |
| 217→ | | 0 | X | 1 | X | 1 | 0 | 1 | 0 | Driver Low | |
| 219→ | | 1 | X | 1 | X | 1 | 1 | 0 | 0 | Driver High | |
| | 1 | X | X | X | 0 | 0 | 0 | 0 | 0 | Floating | TEST |
| | | X | 0 | X | 1 | 0 | 0 | 1 | 0 | Driver Low | |
| | | X | 1 | X | 1 | 0 | 1 | 0 | 0 | Driver High | |
| | | X | X | X | 0 | 1 | 0 | 0 | 1 | Termination 'ON' | |
| | | X | 0 | X | 1 | 1 | 0 | 1 | 0 | Driver Low | |
| | | X | 1 | X | 1 | 1 | 1 | 0 | 0 | Driver High | |

Where, logic states X, 0 and 1 are:
X - "DON'T CARE" Input; Indeterminate Output
0 - False; Zero; Low; Function De-Asserted
1 - True; One; High; Function Asserted

FIG. 4B

DYNAMIC IMPEDANCE CONTROL FOR INPUT/OUTPUT BUFFERS

RELATED APPLICATION

This application is a continuation of U.S. patent application Ser. No. 15/457,680 filed on Mar. 13, 2017, which is a continuation of Ser. No. 15/079,085 filed on Mar. 24, 2016; which is a continuation of U.S. patent application Ser. No. 14/499,275, filed on Sep. 29, 2014 (now U.S. Pat. No. 9,300,291), which is a continuation of U.S. patent application Ser. No. 13/248,330, filed on Sep. 29, 2011 (now U.S. Pat. No. 8,847,623), which is a continuation of U.S. patent application Ser. No. 12/915,796, filed on Oct. 29, 2010 (now U.S. Pat. No. 8,035,413), which is a continuation of U.S. patent application Ser. No. 12/134,451, filed on Jun. 6, 2008 (now U.S. Pat. No. 7,834,654), which claims the benefit of U.S. Provisional Application No. 60/942,798, filed Jun. 8, 2007, the disclosures of which are hereby incorporated by reference in their entireties.

FIELD OF THE INVENTION

The invention relates to impedance control for input/output buffers.

BACKGROUND OF THE INVENTION

Synchronous Dynamic Random Access Memory (SDRAM) Memory Controllers are used in Personal Computers and in a wide variety of electronics products, generally, where microprocessors and SDRAM are imbedded in the product to define the control features and user interface of the product. SDRAM Memory Controllers allow microprocessors to efficiently access high-speed SDRAM when running programs.

As chip manufacturers relentlessly scale down silicon process feature size, driving silicon technology towards better and better electrical and economic performance, serious signal integrity issues arise in the physical interface between chips in system applications, as clock and data rates often double with each new generation. At higher clock rates signal integrity breaks down, primarily, due to transmission line effects in the interconnect between the memory controller chip and SDRAM chip.

Transmission line effects, which include reflections, attenuation, cross-talk and ground bounce, all play a role in degrading signal quality in the interconnect between chips. Reflections in the chip-to-chip interconnect, if not managed properly, can completely destroy signal integrity in any high-speed system.

All transmission lines have a characteristic impedance and a characteristic signal velocity which are defined by conductor geometry and dielectric constant of the insulating medium surrounding the conductors. Signal reflections propagating back and forth over transmission lines can degrade signal quality to the point of non-viability if not controlled. However, no signal reflections occur in a transmission line if the source impedance of the circuit driving one end of the transmission line and the terminating impedance of circuits at the other end of the line match the characteristic impedance of the transmission line. When using semiconductor circuits, typically CMOS (complementary metal oxide semiconductor) transistors, to drive signals off-chip onto printed circuit board (PCB) traces to be received by semiconductor circuits on other chips on the printed circuit board, significant signal reflections often occur if the receiving ends of the traces are not terminated with some impedance that closely matches the transmission line impedance.

Previously, high speed signals were driven with I/O (input/output) buffers having output impedances that were much lower than the characteristic impedance of the PCB trace. The PCB traces were terminated using fixed resistors with resistance values matching the characteristic impedance of the trace. In some applications fixed resistors were also placed in series with the driving buffer to improve signal integrity. The advent of DDR (double data rate) SDRAM drove the semiconductor industry to find ways of internalizing source and termination impedances to dispose of the fixed external resistors needed to match PCB trace impedances in these new memory systems. The incentive is always to lower costs and reduce power consumption. It was clearly demonstrated that good signal integrity can be obtained in DDR Memory systems when there is a matched termination impedance. So long as the termination absorbed the signal propagating to the end of the line, no reflections occurred. In these systems, the source impedance of the circuits driving the line were purposely made lower than the characteristic impedance of the PCB traces to produce a bigger signal swing for better noise immunity.

CMOS I/O circuits can be designed to match transmission line impedances fairly well under specific conditions but exhibit large impedance variations, often exceeding 2:1, over the full Process, Voltage and Temperature (PVT) range expected for the circuit. To counter the PVT variation, circuit designers have been building in some adjustability for the Off-Chip Drive (OCD) and the On-Die Termination (ODT).

A number of solutions for programmable output impedance are in use today notably in High-Speed Transceiver Logic (HSTL) and DDR applications. In many cases there are as few as two drive settings for output impedance control. In many cases the output impedances are not dynamically set against an impedance reference.

SUMMARY

According to one broad aspect, the invention provides a combined drive and termination circuit comprising: a variable impedance pull-up network; a variable impedance pull-down network; at least one control input for setting a configuration of the pull-up network; at least one control input for setting a configuration of the pull-down network; the apparatus having a termination mode of operation in which the variable impedance pull-up network is configured to have a pull-up network termination impedance and the variable impedance pull-down network is configured to have a pull-down network termination impedance, the pull-up network and the pull-down network in combination functioning as a split termination; the apparatus having a drive mode of operation in which: to drive a high output, the pull-up network is configured to generate a specific impedance when switched ON; to drive a low output, the pull-down network is configured to generate a specific impedance when switched ON.

In some embodiments, an apparatus comprising: core logic; a plurality of I/Os (input/outputs), each having a respective I/O pad; for each I/O, a respective combined drive and termination circuit as summarized above; the combined drive and termination circuits functioning to generate outputs from the core logic and to terminate external inputs for the core logic.

In some embodiments, the pull-up and pull-down networks are switched dynamically between two impedance settings when commutating between drive and termination modes.

In some embodiments, the apparatus further comprises: for each I/O, pre-driver logic comprising AND-OR-AND logic, that receives a first input to indicate drive high, a second input to indicate drive low, and a third input to indicate termination, and switches between two impedance settings accordingly.

In some embodiments, the circuit in combination with a calibration logic that calibrates the impedances against an impedance reference.

In some embodiments, an apparatus comprises: core logic; a plurality of inputs each having a respective input pad, and a plurality of outputs each having a respective output pad; for each input pad, a respective combined drive and termination circuit as summarized above permanently configured to be in termination mode; for each output pad, a respective combined drive and termination circuit as summarized above permanently configured to be in drive mode.

In some embodiments, an apparatus comprises: the combined drive and termination circuit as summarized above; a controller that generates the control inputs as a function of whether the combined drive and termination circuit is in a drive mode or a termination mode.

In some embodiments, the pull-up network comprises a plurality of transistors connected together in parallel, the variable impedance of the pull-up network being controlled by selectively turning on some number of the plurality of transistors; the pull-down network comprises a plurality of transistors connected together in parallel, the variable impedance of the pull-down network being controlled by selectively turning on some number of the plurality of transistors.

In some embodiments, An apparatus comprises: the combined drive and termination circuit as summarized above; a replica of at least part of the combined drive and termination circuit for use in performing calibration.

In some embodiments, the apparatus further comprises: a controller that controls calibration being performed in four steps: 1) pull-up network calibration for drive mode when a data output is logic high; 2) pull-down network calibration for drive mode when a data output is logic low; 3) pull-up network calibration for termination mode; and 4) pull-down network calibration for termination mode.

In some embodiments, the pull-up network comprises a plurality of P-type mosfet transistors, and the pull-down network comprises a plurality of N-type mosfet transistors, the apparatus further comprising a controller that controls calibration being performed in four steps: 1) N device output impedance calibration to determine how many of the N-type transistors to enable for drive mode when a data output is logic low; 2) P device output impedance calibration to determine how many of the P-type transistors to enable for drive mode when a data output is logic high; 3) N device termination calibration to determine how many of the N-type transistors to enable for termination mode; and 4) P device termination calibration to determine how many of the P-type transistors to enable for termination mode.

In some embodiments, the pull-up network and the pull-down network are each formed entirely of P-type transistors or N-type transistors, the apparatus further comprising: a controller that controls calibration being performed in two steps: 1) pull-up network calibration for drive mode when a data output is logic high; and 2) pull-up network calibration for termination mode.

In some embodiments, the pull-up network comprises a plurality of N-type mosfet transistors, and the pull-down network comprises a plurality of N-type mosfet transistors, the apparatus further comprising a controller that controls calibration being performed in two steps: 1) N device output impedance calibration to determine how many of the N-type transistors to enable for drive mode when a data output is logic low; 2) N device termination calibration to determine how many of the N-type transistors to enable for termination.

In some embodiments, the apparatus further comprises: interconnections that pass common calibration values to each combined drive and termination circuit.

In some embodiments, the interconnections deliver the calibration values using one or more thermometer codes.

In some embodiments, the pull-up network comprises P-type transistors, and the pull-down network comprises N-type transistors, and wherein the interconnections deliver: a first calibration value that sets how many of the N-type transistors to enable for drive mode when a data output is logic low; a second calibration value that sets how many of the P-type transistors to enable for drive mode when a data output is logic high; a third calibration value that sets how many of the N-type transistors to enable for termination mode; and a fourth calibration value that sets how many of the P-type transistors to enable for termination mode.

In some embodiments, an apparatus comprises: a plurality of combined drive and termination circuits as summarized above; interconnections that pass common calibration values to each combined drive and termination circuit; for each combined drive and termination circuit, a pre-driver circuit that selectively applies one of the calibration values as a function of whether the particular combined drive and termination circuit is in drive mode outputting a logic low or outputting a logic high, or in termination mode.

According to another broad aspect, the invention provides a combined ODT (on-die termination) and OCD (off chip drive) circuit comprising drive transistors that double as termination transistors.

According to another broad aspect, the invention provides an on-chip termination circuit comprising: at least one pull-up transistor connected to at least one pull-down transistor; an input connected between the pull-up transistor and the pull-down transistor, the at least one pull-up transistor and the at least one pull-down transistor functioning to terminate the input.

In some embodiments, the at least one pull-up transistor comprises a first plurality of transistors that can be selectably enabled, and the at least one pull-down transistor comprises a second plurality of transistors that can be selectably enabled, the number of the first and second plurality of transistors that are enabled setting a termination impedance of the circuit.

According to another broad aspect, the invention provides a method of providing combined drive and termination, the method comprising: in a termination mode of operation, configuring a variable impedance pull-up network to have a pull-up network termination impedance and configuring a variable impedance pull-down network to have a pull-down network termination impedance, the pull-up network and the pull-down network in combination functioning as a split termination; in a drive mode of operation, to drive a high output, configuring the pull-up network to generate a first drive impedance; in the drive mode of operation, to drive a low output, configuring the pull-down network to generate a second drive impedance.

In some embodiments, the method further comprises: selecting the mode of operation between the termination mode and the drive mode.

In some embodiments, configuring the pull-up network to have a pull-up termination impedance comprises selectively turning on some number of a plurality of transistors forming the pull-up network; configuring the pull-down network to have a pull-down termination impedance comprises selectively turning on some number of a plurality of transistors forming the pull-down network.

In some embodiments, the method further comprises: performing calibration to calibrate the pull-up termination impedance, the pull-down termination impedance, the first drive impedance and the second drive impedance.

In some embodiments, performing calibration comprises: calibrating the pull-up network for drive mode when a data output is logic high; calibrating the pull-down network for drive mode when a data output is logic low; calibrating the pull-up network for termination mode; and calibrating the pull-down network calibration for termination mode.

In some embodiments, performing calibration comprises: calibrating the pull-up network for drive mode when a data output is logic high to produce a first calibration result; using the first calibration result to calibrate the pull-down network for drive mode when a data output is logic low; calibrating the pull-up network for termination mode to produce a second calibration result; using the second calibration result to calibrate the pull-down network for termination mode.

BRIEF DESCRIPTION OF THE DRAWINGS

Embodiments of the invention will now be described with reference to the attached drawings in which:

FIG. 4B is a truth table for the logic diagram of FIG. 4A;

DETAILED DESCRIPTION

Figure 1:
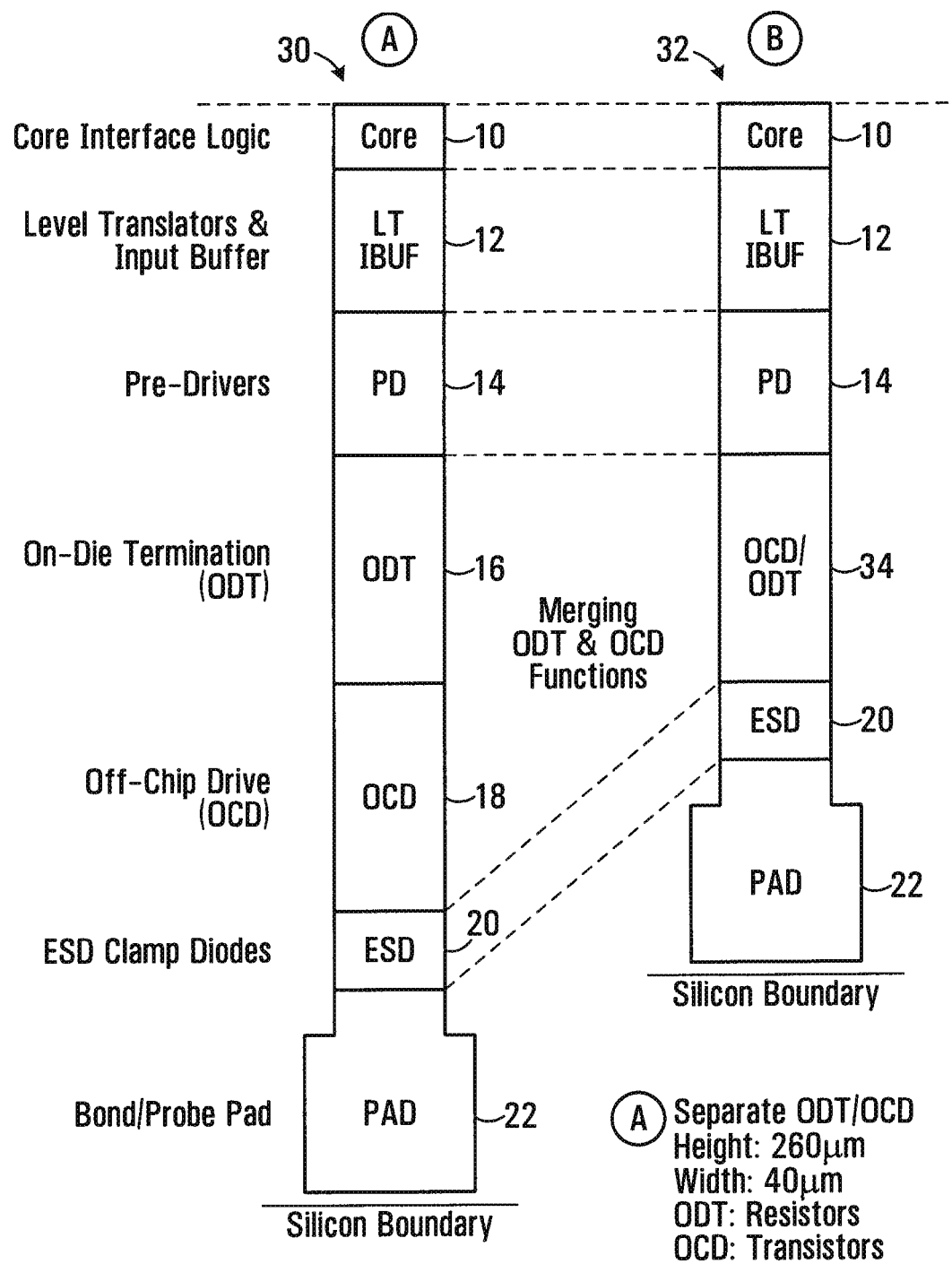
FIG. 1 is a floor comparing a conventional cell architecture with a cell architecture provided by an embodiment of the invention.

Referring now to FIG. 1, shown is a floorplan of two different DDR Input/Output (I/O) cell architectures. Generally indicated at 30 is a conventional cell architecture that includes core interface logic 10, level translators and input buffer 12, pre-drivers 14, On-Die Termination (ODT) 16, Off-Chip Drive (OCD) 18, ElectroStatic Discharge (ESD) clamp diodes 20 and bond/probe pad 22. See for example Jedec Standard; DDR2 SDRAM Specification, JESD79-2E (Revision of JESD79-2D), April 2008.

Generally indicated at 32 is a cell architecture provided by an embodiment of the invention in which there is again a core 10, level translators and input buffer 12, pre-drivers 14, ESD 20 and pad 22. However in this embodiment, the on-die termination 16 and off-chip drive 18 are not separate components; rather a combined On-Die Termination/Off-Chip Drive (OCD/ODT) 34 is provided.

While the cell I/O architecture 32 of FIG. 1 is contemplated for use as the I/O of a memory controller that is connected to a memory device such as an SDRAM memory device, the I/O architecture may find other applications such as on the actual memory devices themselves and any high-speed CMOS chip-to-chip interconnect for example including CPUs, FPGAs, controllers, memories etc.

Note that in the conventional architecture 30, there is a separate ODT and OCD; in an example set of possible implementation-specific dimensions, the total height is 260 µm and the width is 40 µm. The ODT 16 is typically implemented using resistors and the OCD 18 is typically implemented using transistors.

For the new cell architecture 32, there is a merged ODT/OCD, and the result is that, in an example set of possible implementation specific dimensions, the cell architecture has a total height of 200 µm. The ODT and OCD are implemented using shared transistors.

FIG. 1 is a specific example of where the OCD/ODT function might be implemented within a cell architecture. More generally, the merged OCD/ODT circuit provided herein can be used in any cell architecture that requires both termination and drive. In yet another embodiment, the merged OCD/ODT circuit is implemented in cells that have dedicated termination and drive functions, with separate instances of the same circuit being employed for each thereby simplifying design and testing.

Figure 2A:
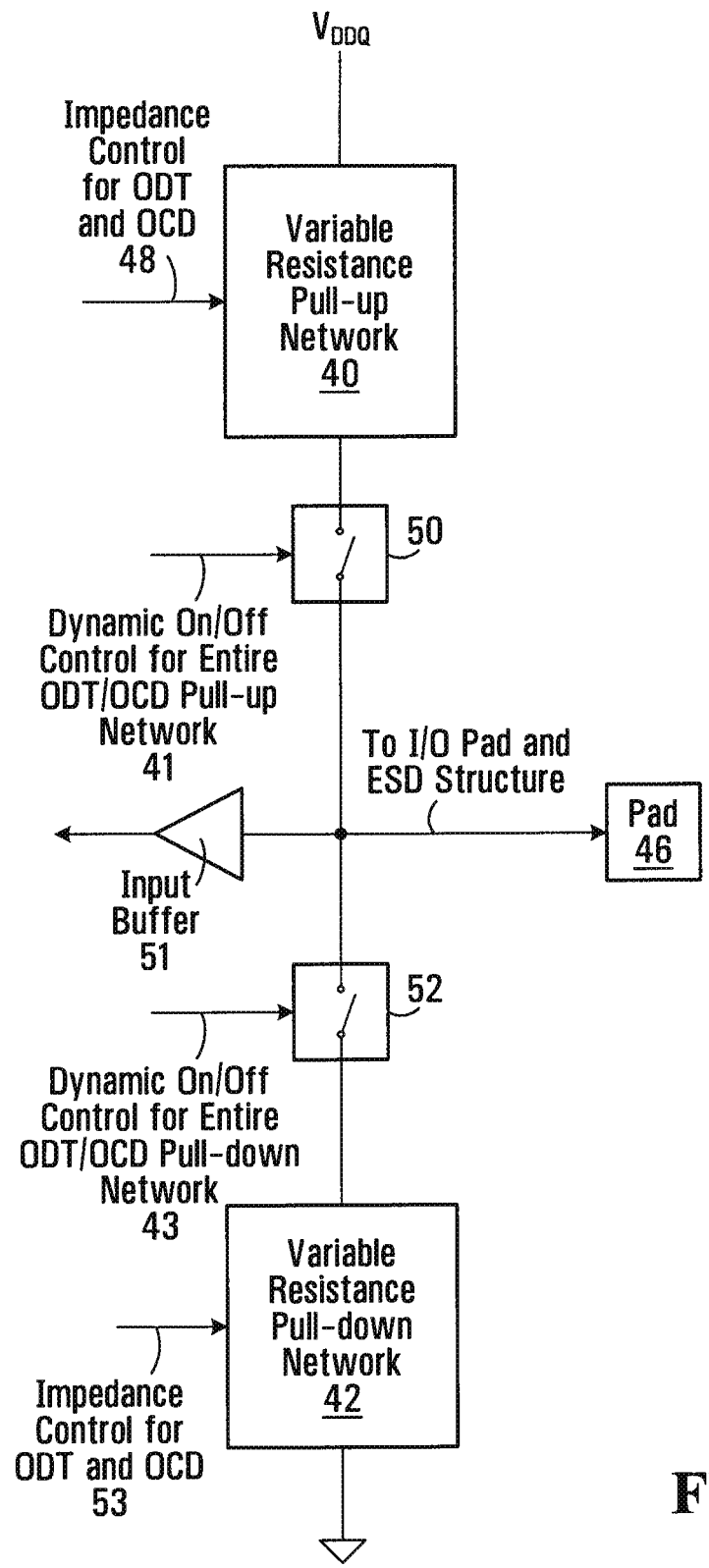
FIG. 2A is a block diagram of a merged on chip drive/on die termination provided by an embodiment of the invention.

Referring now to FIG. 2A, shown is a simple block diagram of a merged ODT/OCD. Shown is a variable resistance pull-up network 40 connected to a variable resistance pull-down network 42 through switches 50,52 respectively. Switch 50 when closed connects the pull-up network 40 to the I/O pad 46 and ESD structure (not shown). The switch 50 has an input 41 which provides dynamic ON/OFF control for the entire ODT/OCD pull-up network. Switch 52 when closed connects the pull-down network 42 to the I/O pad 46 and ESD structure. Similarly, the switch 52 has an input 43 which provides dynamic ON/OFF control for the entire ODT/OCD pull-down network. The control 41 allows turning the pull-up network for each of ODT and OCD functionality ON and OFF at high speed. Similarly, the control 43 allows for turning the pull-down network for each of ODT and OCD functionality ON and OFF at high speed. The first and second ON/OFF controls 41,43 dynamically switch the pull-up and pull-down resistance networks ON or OFF for generating outputs or receiving inputs. Typically, the pad 46 is connected via a PCB trace to a memory device such as an SDRAM (not shown). The pull-up network 40 has a control input 48 that provides an impedance control input for each of ODT and OCD. The pull-down network 42 has a control input 53 that provides a impedance control for each of ODT and ODT. Also shown is an input buffer 51. The input buffer is connected to receive a signal from the pad 46, and to pass this towards the core (not shown) via receiver circuitry (also not shown). Both of the variable resistance networks 40,42 are primarily transistor networks having variable resistance. In some embodiments, these variable resistance networks consist of a set of transistors that can be switched in and out of the circuit so as to vary the ON resistance of the circuit accordingly. The OFF resistance of the network is substantially that of an open circuit exhibiting leakage current only. In some embodiments, the first and second resistance controls (48,53) are quasi-static controls whose states, once set for specific calibrated resistances, need not change again so long as operating conditions for the resistance network do not cause the resistance to change significantly. On re-calibration the states of the resistance controls can be changed to achieve the desired resistance for the different operating conditions.

To function in ODT mode, the first and second ON/OFF controls 41,43 turn ON the pull-up network 40 and the pull-down network 42 respectively. In addition, the impedance control inputs 48,53 are used to set the resistance of the pull-up network 40 and the pull-down network 42 to the calibrated values for termination. A received signal is input via the pad 46, passed through input buffer 51 and passed on to the remainder of the circuit (not shown). By concurrently turning on transistors in both the pull-up network and the pull-down network, the output driver can be used to create the impedance behaviour of a split termination resistor network. In other words, output transistors of the controller can be used to terminate an input signal.

To function in OCD mode, when a logic high is to be output, the control inputs 41,43 turn ON the pull-up network 40, and turn OFF the pull-down network 42. In addition, the impedance control 48 is used to set the resistance of the pull-up network 40 to the calibrated value for the pull-up network for drive. When a logic low is to be output, the control inputs 41,43 turn ON the pull-down network 42 and turn OFF the pull-up network 40. In addition, impedance control input 53 is used to set the resistance of the pull-down network to the calibrated value for the pull-down network for drive. Note that the OCD and ODT functions are mutually exclusive.

Figure 2B:
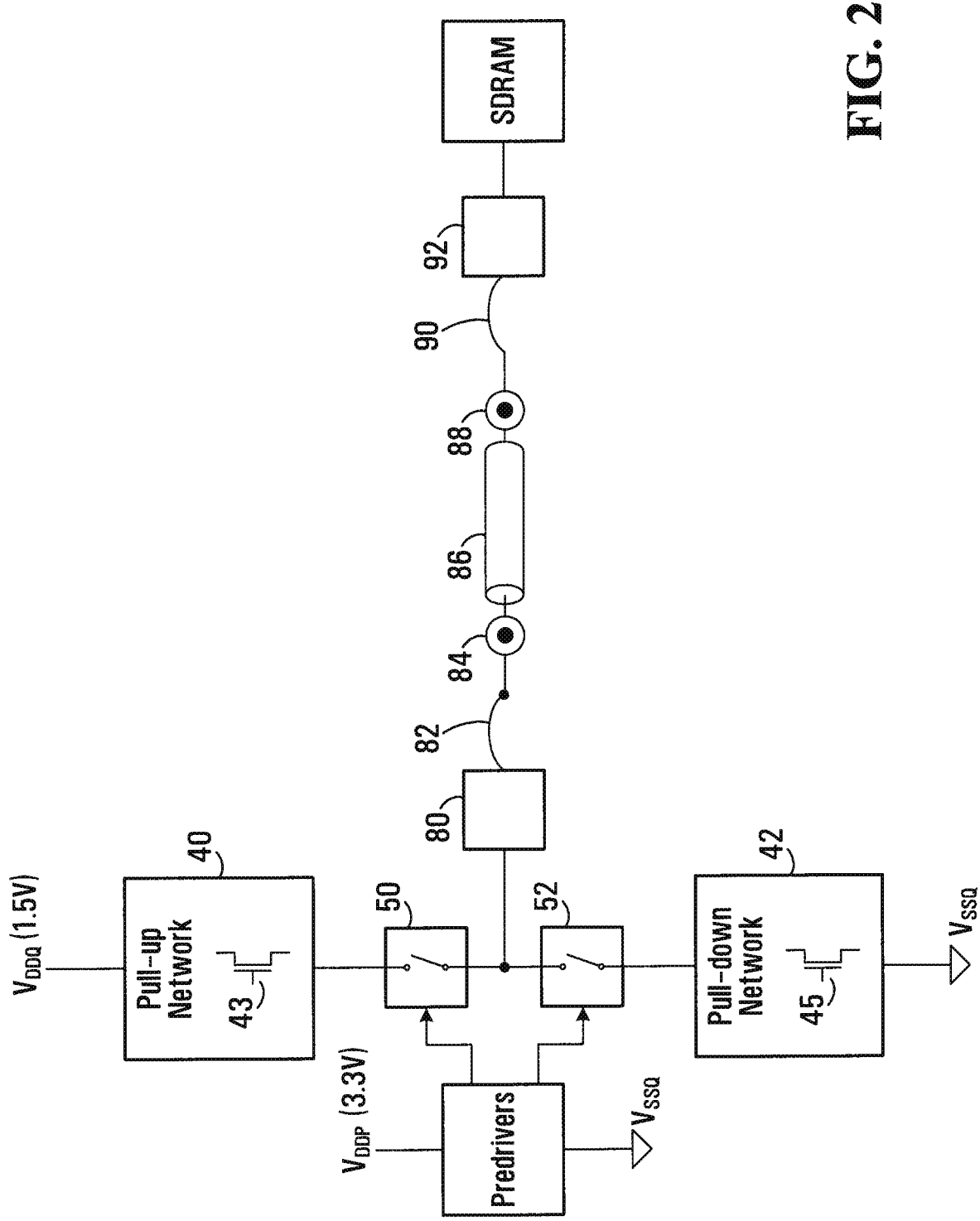
FIG. 2B is a block diagram of a merged on chip drive/on die termination provided by an embodiment of the invention, suitable for quad data rate applications.

Quad Data Rate (QDR) SRAM (static random access memory) is a type of SRAM with independent input and output pads. The merged ODT/OCD can still find application for connecting to such a device because separate instances of a common I/O cell design can be used for both input and output, thereby simplifying design. In this case, a given merged ODT/OCD instance will be permanently configured to be either ODT or OCD. FIG. 2B illustrates a specific example in which a merged ODT/OCD function similar to that of FIG. 1 is used for a Quad Data Rate (QDR) SRAM controller in communication with a QDR SRAM through an electrical path. In the illustrated example, the electrical path includes, from the controller to the SRAM, a chip bondpad 80 of the controller, a package lead 82 of the controller, a ball 84, a circuit board trace 86, another ball 88, a package lead 90 of the SRAM, and a chip bond pad 92 of the SRAM. The figure is not to scale, in that typically the circuit board trace 86 is significantly longer than all of the other elements of the electrical path. The electrical path does not behave as a perfect interconnection node, and consequently some parasitic resistance, inductance and capacitance is associated with the electrical path which can subject high-speed signals to severe transmission line effects. Note that the additional receive circuitry (e.g. receive buffer, etc.) is not shown, but would be present at least for instances of the circuit being used for ODT.

Output impedance varies inversely in relation to the number of transistors in the QDR output driver that are turned ON. Referring to FIG. 2B there will typically be at least several (e.g. 16) NMOS transistors 43 in the pull-up network 40, and also there will be a similar number of NMOS transistors 45 in the pull-down network 42. In some implementations, for calibration purposes only the pull-up network 40 needs to be turned ON because the transistors in both networks A and B are of the same type (NMOS in this case) and have been sized in design to provide identical pull-up and pull-down impedances at the calibration voltage ($V_O = V_{DDQ}/2$).

Figure 2C:
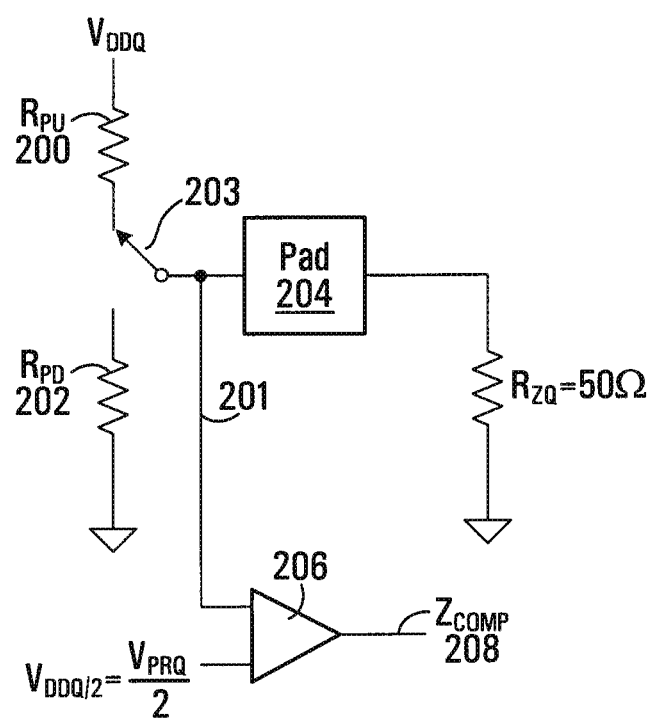
FIG. 2C is a circuit diagram illustrating how calibration can be performed.

Referring to FIG. 2C, shown is an example model of how calibration can be performed in a circuit with pull-up networks and pull-down networks formed of transistors of the same type. A replica of an I/O cell is used for calibration purposes. The pull-up network is depicted as $R_{PU}$ 200 and the pull-down network is depicted as $R_{PD}$ 202. The switching is configured such that $R_{PU}$ is always connected, and $R_{PU}$ is always disconnected. This is shown as a single switch 203, but can also be implemented using a pair of switches equivalent to switch 50,52 of FIG. 2A and/or using the transistors that implement the variable resistance pull-up and pull-down networks, with the connection of $R_{PU}$ being equivalent to switch 50 of FIG. 2A being open, and switch 52 being closed. The replica circuit is connected through a pad 204 to a reference resistor $R_{ZQ}$ that is 50 ohms in the illustrated example. The output 201 of the replica circuit is also connected to one input of an analog comparator 206. Analog comparator 206 has as a second input 203 connected to a reference voltage set to $V_{DDQ}/2$ in the illustrated example. The output $Z_{COMP}$ 208 of the analog comparator 206 is low when the output 201 of the circuit is less than the reference voltage 203 and is high when the output 201 of the circuit is greater than the reference voltage 203. The output $Z_{COMP}$ 208 is indeterminant when the output $V_0$ 201 is equal to the reference voltage 202. To calibrate the output impedance, $R_{PU}$ 200 is varied (by varying the circuit configuration, for example by varying the number of transistors that contribute to the resistance) until $Z_{COMP}$ 208 switches from a 'zero' to a 'one'. When this happens, the output voltage just exceeds the reference voltage, and the circuit configuration is identified for use in setting the output impedance of the actual I/O cells. Note than when output $V_0$ 201 is very close to $V_{DDQ}/2$, the pull-up resistance is very close in value to that of the calibration resistor $R_{ZQ}$ by virtue of the equal voltages across each resistor having the same current.

In some embodiments, the analog comparator 206 is implemented using a DDR input buffer. Such buffers are specialized analog comparators that are designed for speed rather than accuracy or gain. The output of such an analog comparator is digital and is designed to switch abruptly from one logic level to another depending on the relative values of its analog inputs.

For example, to calibrate the output impedance so that it matches the 50Ω resistance illustrated in FIG. 2C, the number of turned ON transistors can be progressively varied by changing select/enable signals applied to gates of the pull-up transistors of the reference driver pull-up network until output $V_0$ 201 is greater than but as close as possible to $V_{DDQ}/2$. Proper calibration for the QDR output driver will be at this setting and, once the reference QDR output driver is set, the correct number of output driver transistors (X), in all QDR drivers sharing the calibration reference driver settings, will be turned ON during normal operation. For example, X of 16 transistors in the pull-up network will be turned ON when the line is driven high, and X of 16 transistors in the pull-down network will be turned ON when the line is driven low.

The pull-up network and the pull-down network of FIG. 2B are of both formed of n-type transistors. This is particularly suitable for QDR applications. As detailed above, this enables a simplified calibration to be performed. More generally, in any implementation that features a pull-up network and a pull-down network formed of transistors of the same type, only one or the other of the pull-up and pull-down networks need be calibrated for each of ODT and OCD, since the calibration value will be the same for the pull-up network and the pull-down network.

In the examples of FIGS. 2A and 2B, the pull-up network is shown separately from the switching element that enables the pull-up network, and the pull-down network is shown separately from the switching element that enables the pull-down network. However, in some embodiments the switching function is implemented by the transistors forming part of the pull-up and pull-down networks.

Figure 2D:
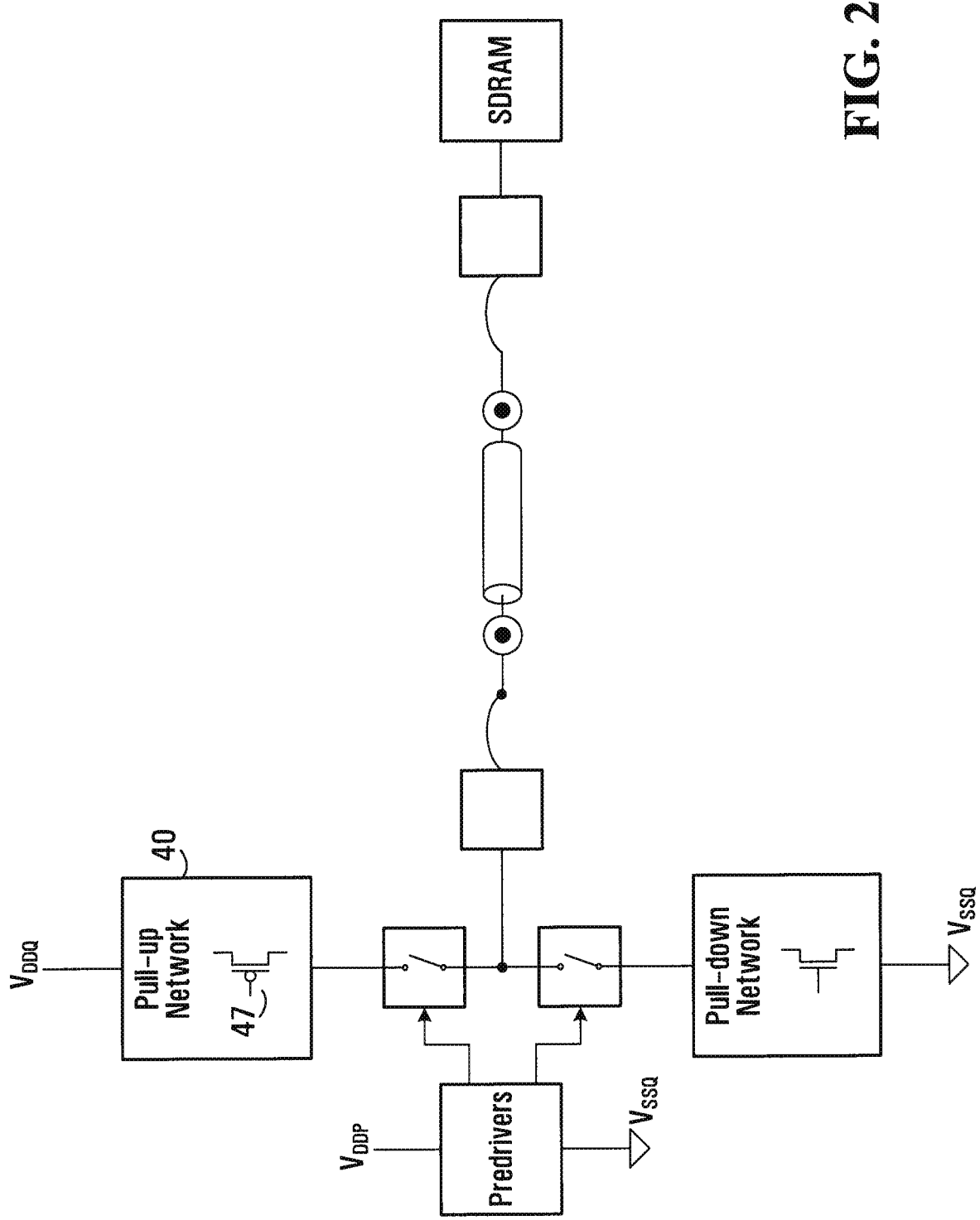
FIG. 2D is a block diagram of a merged on chip drive/on die termination provided by an embodiment of the invention, suitable for DDR3 applications.

An example of an output driver for a DDR3 controller is illustrated in FIG. 2D. The DDR3 output driver is somewhat similar to the QDR controller output driver shown in FIG. 2B; however the pull-up network 40 is composed of PMOS transistors 47 rather than NMOS transistors. Because of this, it is necessary to perform calibration of the pull-up network and the pull-down network separately, since the PMOS and NMOS transistors may have different resistance characteristics. There is also a receive buffer (not shown) for ODT mode operation. With DDR3, each I/O functions in both input and output mode, during mutually exclusive times.

By concurrently turning on transistors in both the pull-up network and the pull-down network, the DDR3 output driver can be used to create the impedance behaviour of a split termination resistor network. In other words, output transistors of the DDR3 controller can be used to terminate an input signal.

Figure 3:
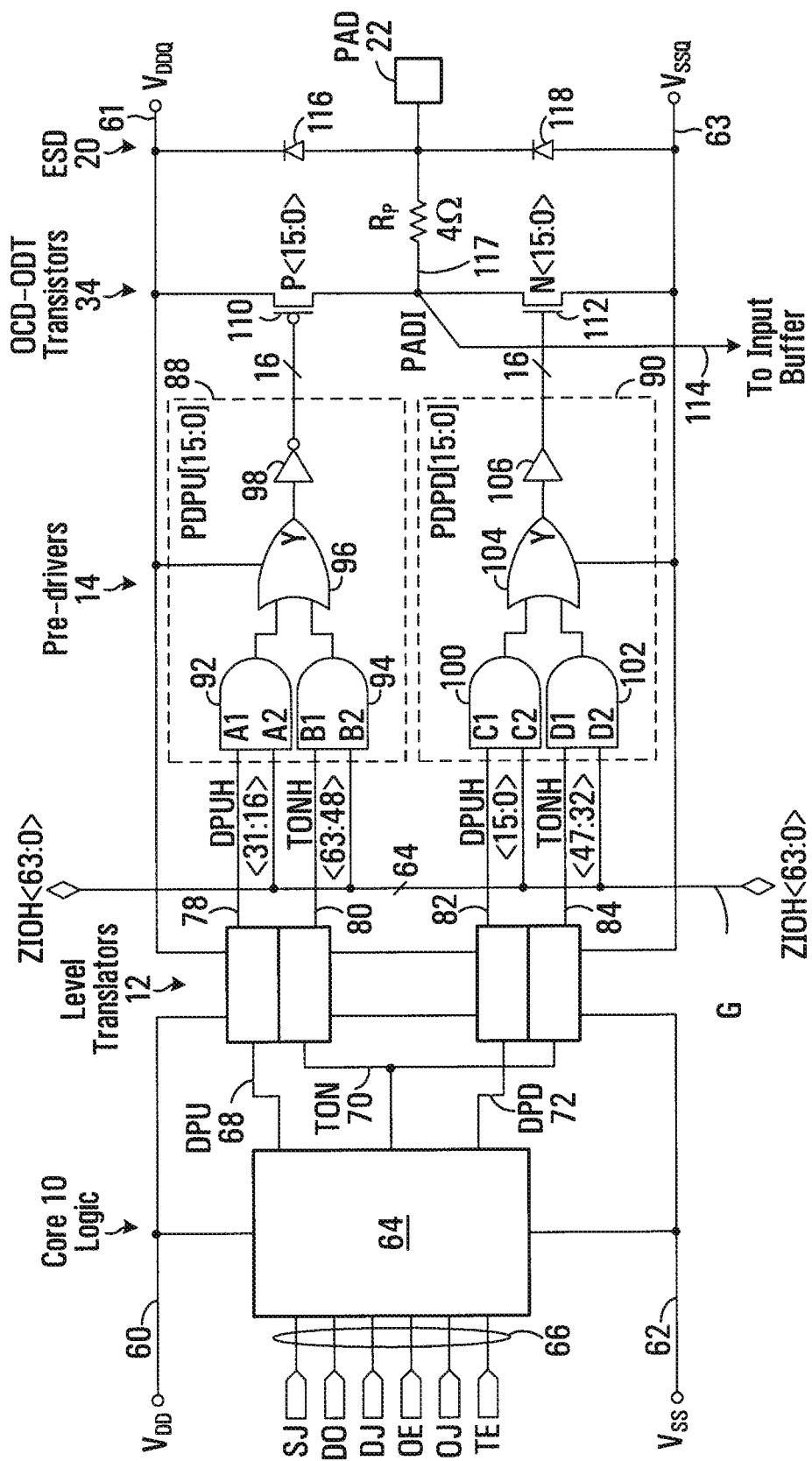
FIG. 3 is a detailed block diagram of an I/O cell architecture provided by an embodiment of the invention.

A detailed implementation of an I/O cell architecture consistent with the cell architecture 32 of FIG. 1 will now be described with reference to FIG. 3. As described below, the circuit of FIG. 3 is shown to include test inputs which are for the purpose of testing, and normal inputs. It is to be understood that the test inputs and corresponding circuitry could be omitted without affecting the normal operation of the circuit. Elements that are in common with those of FIG. 1 are similarly numbered. In particular, the circuit is shown to include core logic 10, level translators 12, pre-drivers 14, combined OCD/ODT transistors 34 that include pull-up p-type transistors P<15:0>110 and pull-down n-type transistors N<15:0>112, ESD 20 consisting of ESD clamp diode 116 and ESD clamp diode 118 and pad 120. For this example, it is assumed that the pre-drivers 14 include 16 pre-drivers 88 that drive 16 pull-up transistors 110, and 16 pre-drivers 90 that drive 16 pull-down transistors 112, but this number is implementation specific. The pull-up transistors 110 are connected to the pull-down transistors 112 at a point labeled PAD Internal net (PADI). Also shown is resistance $R_P$ 117 that connects PADI to the pad 22. Resistor $R_P$ is a diffusion-type resistor of large layout area that is used to protect the output transistors from destructive ESD effects. The resistor limits ESD currents into the output transistors which, if excessive, can trigger snap-back in the transistors, damaging them. Having this resistor in place prevents snap-back from occurring. Resistor $R_P$ is part of the PAD ESD structure 20. PADI is also connected at 114 to the input buffer (not shown). The circuit has connections for $V_{DD}$ 60, $V_{SS}$ 62, $V_{DDQ}$ 61 and $V_{SSQ}$ 63. These are power rail terminals of the I/O cell. The power rail is a metal bus used to distribute power to the I/O cells arranged along the periphery of a silicon chip. $V_{DDQ}$ is connected to the I/O power supply which, for example, is nominally set to 2.5V for DDR1, 1.8V for DDR2 and 1.5V for DDR3. $V_{SSQ}$ is the I/O ground return for the $V_{DDQ}$ power supply. The $V_{DD}$ terminal is connected to the core supply which, for contemporary deep-submicron technologies, is typically set to voltages in the range of 1.0 to 1.2 Volts. $V_{SS}$ is the core ground return for the $V_{DD}$ power supply. Although both nominally 0.0 Volts, $V_{SSQ}$ and $V_{SS}$ are separate on-die ground nets. The two grounds are separate to isolate the core from I/O switching noise.

The core logic 10 includes a circuit 64 that receives inputs 66 consisting of SJ, DO, DJ, OE, OJ, TE. The function of these inputs is as follows:

SJ selects normal inputs (DO and OE) when low and selects test inputs (DJ and OJ) when high;

DO is the normal data output to the pad when OE=1. Pad is high when DO=1, and pad is low when DO=0;

DJ is the test data output to the pad when OJ=1. Pad is high when DJ=1 and pad is low when DJ=0;

OE is the normal output enable. When OE=1 the Off-Chip Driver (OCD) is enabled and the On-Die Termination (ODT) is disabled. When OE=0, the OCD is disabled (tri-state) and the ODT is enabled if TE=1;

OJ is the test output enable, and has the same functionality as OE; and

TE is the termination enable. This allows the pad driver transistors to function as a split termination. When TE=1, the termination will turn ON when the OCD are tri-state (OE (or OJ)=1). This will usually be low for drive-only applications and high for data I/O applications.

The outputs of the core logic 64 include DPU 68, TON 70 and DPD 72 which function as follows:

DPU is a drive pull-up control. When this is high, it causes the drive pull-up transistor to turn ON. When low, the drive pull-up transistor turns OFF;

DPD is a drive pull-down control. When this is high, it causes the drive pull-down transistor to turn ON. When low, the drive pull-down transistor turns OFF; and TON is a termination ON control. When high, both pull-up and pull-down transistors are enabled to turn ON together to form a split termination when OE or OJ goes low. When low, the termination function is completely disabled and cannot be influenced by the states of OE or OJ.

The three outputs DPU 68, TON 70, and DPD 72 are input to level translators 12 which produce DPUH 78, TONH 80, DPDH 82 and TONH 84 which are the high voltage versions of DPU 68, TON 70, and DPD 72 used to drive the I/O pre-drivers 88,90.

There is a 64 bit impedance control bus, referred to as ZIOH<63:0> that is used to control the pull-up transistors 110 and the pull-down transistors 112. The impedance control bus ZIOH is a specific example of how the impedance control inputs of FIG. 2A might be implemented. Each pre-driver receives particular bits of the impedance control bus, and particular ones of the level translated outputs DPUH 78, TONH 80, DPDH 82 and TONH 84 as detailed below. ZIOH<63:0> includes the following:

16 bits ZIOH<31:16> for controlling the pull-up transistors 110 in OCD mode, with one bit per transistor;

16 bits ZIOH<63:48> for controlling the pull-up transistors 110 in ODT mode, with one bit per transistor;

16 bits ZIOH<15:0> for controlling the pull-down transistors 112 in OCD mode, with one bit per transistor; and 16 bits ZIOH<47:32> for controlling the pull-down transistors 112 in ODT mode, with one bit per transistor.

Each pre-driver 88 includes an AND gate 92 and an AND gate 94 having respective outputs connected to an OR gate 96 having an output fed through a respective inverting buffer 98 the output of which drives the gate of one of the pull-up transistors 110. AND gate 92 receives DPUH 78 (A1) and one of the bits of ZIOH<31:16> (A2). AND gate 94 receives TONH 80 (B1) and one of the bits of ZIOH<63:48> (B2).

Similarly, each pre-driver 90 includes an AND gate 100 and an AND gate 102 having respective outputs connected to an OR gate 104 having an output fed through a respective non-inverting buffer 106 the output of which drives the gate of one of the pull-up transistors 120. AND gate 100 receives DPDH 82 (C1) and one of the bits of ZIOH<15:0> (C2). AND gate 102 receives TONH 84 (D1) and one of the bits of ZIOH<47:32> (D2).

The AND-OR-AND logic, built into the pre-drivers 88,90, serve as high-speed multiplexers for independent control of driver and termination impedances. The AND-OR-AND logic allows any number of pull-up and pull-down transistors to turn ON and OFF alternately when driving, and any number of pull-up and pull-down transistors to turn ON and OFF together when terminating. The pre-driver logic turns OFF all OCD/ODT transistors 34 that are not selected by the ZIOH<63:0> bus 76 and prevents them from switching. Only the selected OCD/ODT transistors switch at high-speed.

Figure 4A:
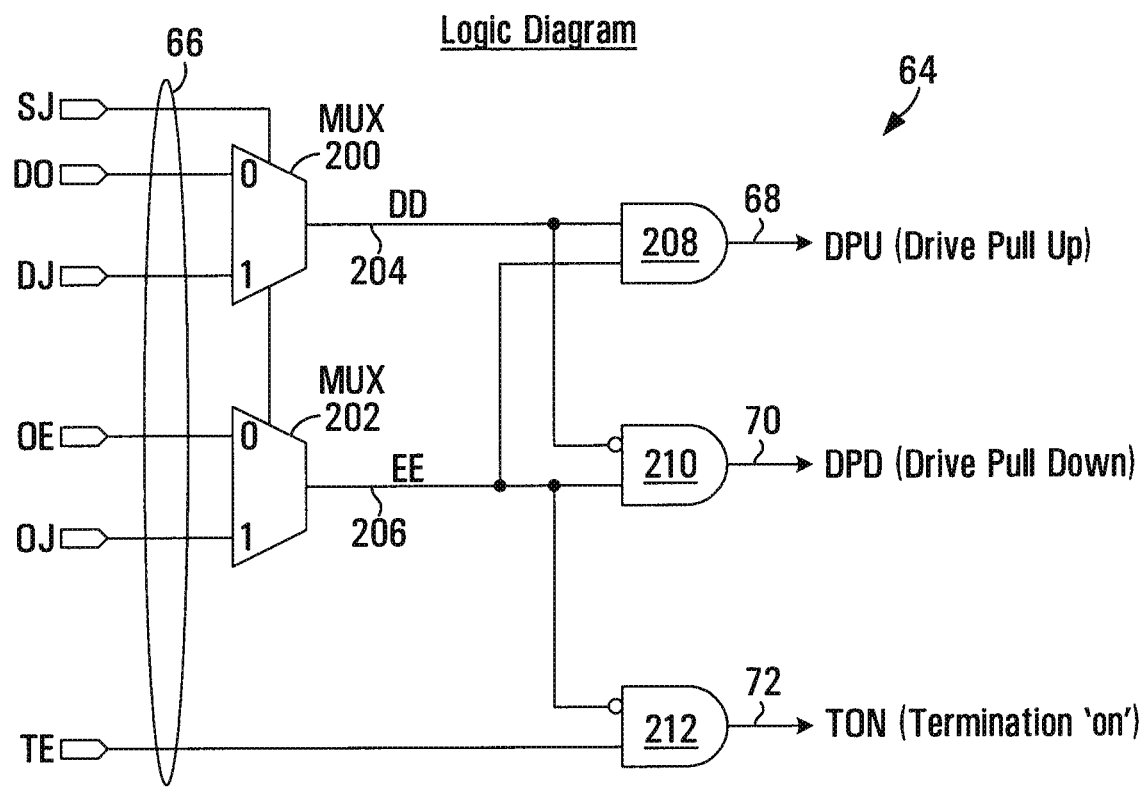
FIG. 4A is a logic diagram of the core logic functionality of FIG. 3.

A detailed example implementation of the circuit 64 of FIG. 3 is shown in FIG. 4A. As in FIG. 3, there are inputs 66 (consisting of SJ, DO, DJ, OE, OJ, TE) and outputs DPU 68, DPD 70 and TON 72. DO and DJ are input to a first multiplexer 200 that produces an output DD 204. OE and OJ are input to a second multiplexer 202 that produces an output EE 206. DD 204 is connected a first input of an AND gate 208, and to an inverting input of AND gate 210 the output of which is DPU 68. EE 206 is connected to a second input of AND gate 208 and to a second input of AND gate 210 the output of which is DPD 70. EE 206 is also connected to a first inverting input of AND gate 212. TE is connected to a second input of AND gate 212 the output of which is TON 72.

Generally indicated at 214 in FIG. 4B is a truth table for the circuit 64 showing how DPU, DPD and TON are generated as a function of SJ, DO, DJ, OE, OJ and TE.

The pre-drivers 88, 90 operate as a function of the level translated DPUH, TONH, TPDH. Normal operation (SJ=0) will be described as opposed to test operation which would be similar.

OCD Mode

In OCD mode operation, OE will be high to enable the output. The state of TE is not relevant so long as OE is high. DO will be 0 or 1 at any given instant reflecting the output to be generated. If DO is 1 (rows 218, 219), then a respective one of pull-up transistors 110 is turned ON by the pre-drivers 88 for each '1' in ZIOH<31:16>. Similarly, if DO is 0 (rows 216, 217), then a respective one of the pull-down transistors 112 is turned ON for each '1' in ZIOH<15:0>.

ODT Mode

The only set of inputs that results in ODT mode being activated are: OE will be low to disable the output and TE=1 to enable ODT (TON=1). This is row 220 of the truth table 214. If TON is 1, then a respective one of pull-up transistors 110 is turned ON by the pre-drivers 88 for each '1' in ZIOH<63:48> and a respective one of the pull-down transistors 112 is turned ON for each '1' in ZIOH<47:32>.

Calibration

In some embodiments, a calibration mechanism is provided in order to identify appropriate numbers of transistors to use for ODT and OCD mode, and in particular to identify how many pull-up and/or pull-down transistors to turn on for each of these modes. In some embodiments, the calibration is carried out dynamically during device operation on a periodic basis to allow for adjustments under changing operating conditions.

In some embodiments, a four stage calibration is performed as follows:

1) N device output impedance calibration—this determines how many of the n-type transistors 112 to enable for OCD mode when DO is 0;

2) P device output impedance calibration—this determines how many of the p-type transistors 110 to enable for OCD mode when DO is 1;

3) N device termination calibration—this determines how many of the n-type transistors 112 to enable for ODT; and 4) P device termination calibration—this determines how many of the p-type transistors 110 to enable for ODT mode.

More generally, pull-up network calibration and pull-down network calibration can be performed in a similar manner. The circuits described are for the most part replicated on a per pin basis. However, in some embodiments, calibration is not performed on a per pin basis. Rather, calibration is performed once, with the expectation that the same calibration results can be applied to all pins. This expectation is reasonable given that the transistors being used for the combined OCD/ODT for multiple pins will be part of the same integrated circuit and hence have similar properties. In some embodiments, a replica of the combined OCD/ODT is used for the purpose of calibration of all of the I/Os.

The number of transistors to include in the combined OCD/ODT can be selected as a function of a desired range of programmability, and a function of the resistance/drive characteristics of the transistors. In some embodiments, a set of transistors are used that provide a range of programmability from 30 ohms to 90 ohms, but this is of course implementation specific.

In some embodiments, a controller encodes a resistance using a gray code, and this is then converted to a thermometer code output. Each codeword of a thermometer code has a single set of zero or more 1's followed by a single set of zero or more 0's to fill up the codeword. Using such a thermometer code ensures that a set of consecutive transistors (pull-up or pull-down) is enabled. In a particular example, a 4-bit gray code is used to indicate one of 16 possible permutations, and this is translated to a 16 bit thermometer code containing a bit per transistor. A gray-to-thermometer decoding scheme can be used rather than a binary-to-thermometer scheme to prevent a glitch from occurring on the driver output while the impedance code (ZIOH<63:0>) is being changed.

The illustrated examples all relate to a combined OCD/ODT circuit. More generally, a circuit that provides combined drive and termination is provided.

Figure 5:
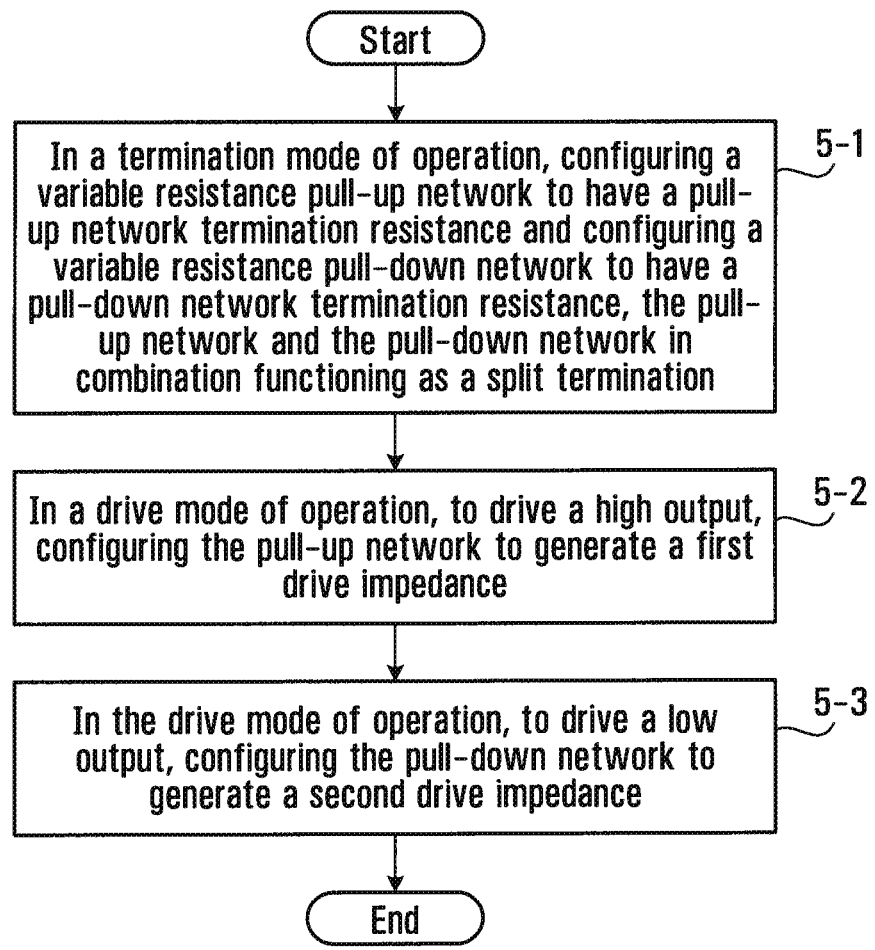
FIG. 5 is a flowchart of a method of providing combined drive and termination.

FIG. 5 is a flowchart of a method of providing combined drive and termination. The method begins in step 5-1 with, in a termination mode of operation, configuring a variable resistance pull-up network to have a pull-up network termination resistance and configuring a variable resistance pull-down network to have a pull-down network termination resistance, the pull-up network and the pull-down network in combination functioning as a split termination. In step 5-2, in a drive mode of operation, to drive a high output, configuring the pull-up network to generate a first drive impedance. In step 5-3, in the drive mode of operation, to drive a low output, configuring the pull-down network to generate a second drive impedance. The order of the execution of the steps in FIG. 5 will obviously depend both on the sequence of drive vs. termination, and will depend on the data being driven while in drive mode.

Figure 6:
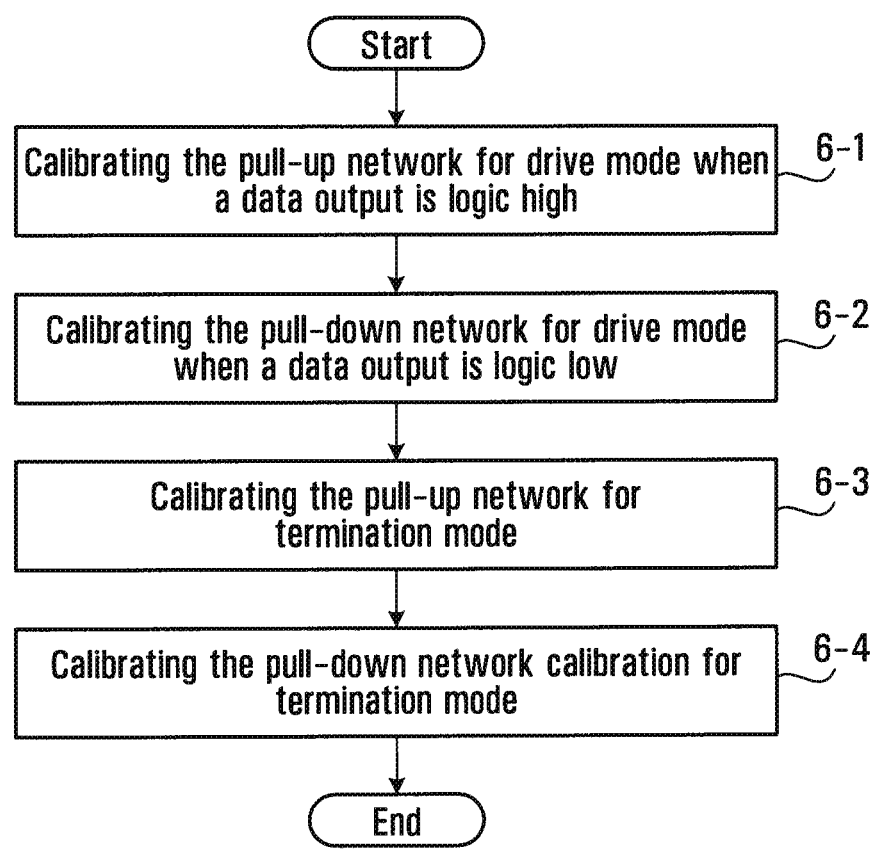
FIG. 6 is a flowchart of a first method of calibrating the method of FIG. 5.

FIG. 6 is a flowchart of a first method of calibrating the method of FIG. 5. The method begins in step 6-1 with calibrating the pull-up network for drive mode when a data output is logic high. The method continues in step 6-2 with calibrating the pull-down network for drive mode when a data output is logic low. The method continues in step 6-3 with calibrating the pull-up network for termination mode. The method continues in step 6-4 with calibrating the pull-down network calibration for termination mode.

Figure 7:
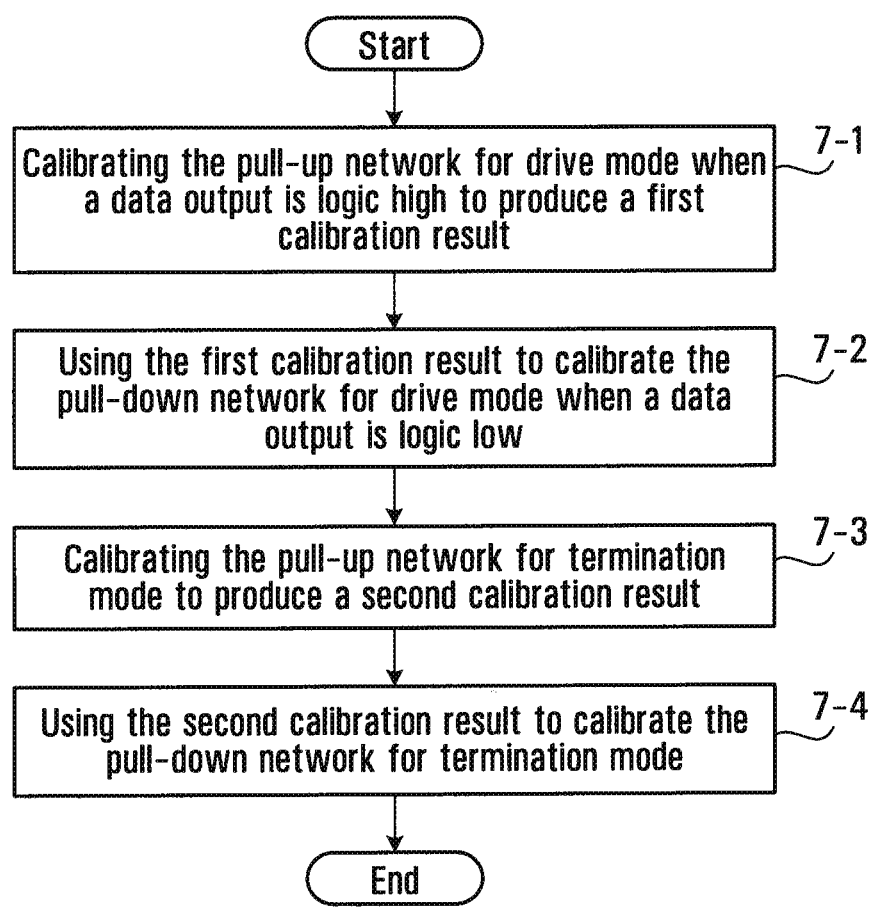
FIG. 7 is a flowchart of a second method of calibrating the method of FIG. 5.

FIG. 7 is a flowchart of a second method of calibrating the method of FIG. 5. The method begins in step 7-1 calibrating the pull-up network for drive mode when a data output is logic high to produce a first calibration result. The method continues in step 7-2 with using the first calibration result to calibrate the pull-down network for drive mode when a data output is logic low. This assumes that the transistors used for the pull-down network and the pull-up network are formed using the same process, and as such the same calibration can be used for both. The method continues at step 7-3 with calibrating the pull-up network for termination mode to produce a second calibration result. The method continues at step 7-4 with using the second calibration result to calibrate the pull-down network for termination mode.

The embodiments described refer to variable resistance pull-up networks, variable resistance pull-down networks, termination resistance, and resistance references. More generally, embodiments may employ variable impedance pull-up networks, variable impedance pull-down networks, termination impedance, and impedance references.

Numerous modifications and variations of the present invention are possible in light of the above teachings. It is therefore to be understood that within the scope of the appended claims, the invention may be practiced otherwise than as specifically described herein.

I claim:

1. A memory device comprising:
   a first plurality of transistors connected in parallel between a first power supply and a data output terminal;
   a first plurality of Off-Chip Drive (OCD) configuration bits;
   a first plurality of On-Die Termination (ODT) configuration bits;
   logic for driving a gate of each of the first plurality of transistors based on the OCD and ODT configuration bits,
      the logic being configurable in an OCD mode to drive the gate of each of the first plurality of transistors based on a state of a respective one of the first plurality of OCD configuration bits to generate a first OCD impedance, and
      the logic being configurable in an ODT mode to drive the gate of each of the first plurality of transistors based on a state of a respective one of the first plurality of ODT configuration bits to generate a first ODT impedance;
   a termination enable signal to enable/disable the first ODT impedance when the memory device is not in the OCD mode; and
   a pad coupled to an external reference resistor (RZQ), the pad configured to be utilized for performing a calibration operation to calibrate the first OCD impedance and the first ODT impedance against an impedance reference of the external reference resistor.

2. The memory device of claim 1, wherein the calibration operation is carried out dynamically on a periodic basis to allow for adjustments under changing operating conditions of the memory device.

3. The memory device of claim 1, further comprising a replica of at least a portion of the first plurality of transistors and the logic for use in performing the calibration operation.

4. The memory device of claim 3, wherein an output of the replica is coupled to a first input of a comparator, the comparator having a second input coupled to a reference voltage.

5. The memory device of claim 1, wherein the first plurality of transistors are substantially equal in size.

6. The memory device of claim 1, further comprising:
   a second plurality of transistors connected in parallel between a second power supply and the data output terminal;
   a second plurality of OCD configuration bits;
   a second plurality of ODT configuration bits; and
   logic for driving the gate of each of the second plurality of transistors based on the OCD and ODT configuration bits,
      the logic being configurable in an OCD mode to drive a gate of each of the second plurality of transistors based on a state of a respective one of the second plurality of OCD configuration bits to generate a second OCD impedance, and
      the logic being configurable in an ODT mode to drive a gate of each of the second plurality of transistors based on a state of a respective one of the second plurality of ODT configuration bits to generate a second ODT impedance.

7. The memory device of claim 6, wherein the second plurality of transistors are substantially equal in size.

* * * * *